United States Patent
Wang et al.

(10) Patent No.: US 9,870,931 B2
(45) Date of Patent: Jan. 16, 2018

(54) PACKAGE CARRIER AND MANUFACTURING METHOD THEREOF

(71) Applicant: Subtron Technology Co., Ltd., Hsinchu County (TW)

(72) Inventors: Chin-Sheng Wang, Hsinchu County (TW); Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 15/000,034

(22) Filed: Jan. 19, 2016

(65) Prior Publication Data

US 2017/0079128 A1    Mar. 16, 2017

(30) Foreign Application Priority Data

Sep. 16, 2015  (TW) ............................. 104130526 A (51) Int. Cl.
*H05K 3/30* (2006.01)
*H01L 21/56* (2006.01)
(Continued)

(52) U.S. Cl.
CPC .......... *H01L 21/56* (2013.01); *H01L 21/4857* (2013.01); *H01L 21/6835* (2013.01);
(Continued)

(58) Field of Classification Search
CPC . H01L 21/4857; H01L 21/56; H01L 21/6835; H01L 23/481; H01L 23/49822;
(Continued)

(56) References Cited

U.S. PATENT DOCUMENTS

| 2012/0181696 A1* | 7/2012 | Sun | ....................... H01L 21/486 257/758 |
| 2012/0279760 A1* | 11/2012 | Sun | ....................... H01L 33/642 174/252 |

(Continued)

FOREIGN PATENT DOCUMENTS

| TW | 200612522 | 4/2006 |
| TW | 201232672 | 8/2012 |

OTHER PUBLICATIONS

"Office Action of Taiwan Counterpart Application", dated Aug. 9, 2016, p. 1-p. 10.

*Primary Examiner* — A. Dexter Tugbang
*Assistant Examiner* — Azm Parvez
(74) *Attorney, Agent, or Firm* — JCIPRNET (57) ABSTRACT

A package carrier includes a substrate, at least one heat conducting element, an insulating material, a first patterned circuit layer and a second patterned circuit layer. The substrate has an upper surface, a lower surface and a through hole. The heat conducting element is disposed inside the through hole and has a first surface and a second surface. The insulating material has a top surface, a bottom surface and at least one cavity extending from the top surface to the heat conducting element. The heat conducting element is fixed in the through hole by the insulating material, and the cavity exposes a portion of the first surface of the heat conducting element. The first patterned circuit layer is disposed on the upper surface and the top surface, and the second patterned circuit layer is disposed on the lower surface and the bottom surface.

12 Claims, 7 Drawing Sheets

(51) Int. Cl.
*H01L 21/683* (2006.01)
*H01L 21/48* (2006.01)
*H01L 23/498* (2006.01)
*H01L 23/13* (2006.01)
*H01L 23/367* (2006.01)
*H01L 23/373* (2006.01)
*H01L 23/31* (2006.01)

(52) U.S. Cl.
CPC .......... *H01L 23/13* (2013.01); *H01L 23/3677* (2013.01); *H01L 23/373* (2013.01); *H01L 23/49822* (2013.01); *H01L 23/49838* (2013.01); *H01L 23/3121* (2013.01); *H01L 23/3731* (2013.01); *H01L 23/3738* (2013.01); *H01L 2221/68359* (2013.01); *H01L 2224/32225* (2013.01); *H01L 2224/32245* (2013.01); *H01L 2224/48091* (2013.01); *H01L 2224/48227* (2013.01); *H01L 2224/73265* (2013.01); *H01L 2924/1531* (2013.01); *H01L 2924/15153* (2013.01); *Y10T 29/4913* (2015.01)

(58) Field of Classification Search
CPC  H01L 23/49838; H05K 1/021; H05K 1/0298; H05K 1/115; H05K 1/183; H05K 1/0201; H05K 1/0204; H05K 1/0203; Y10T 29/4913; Y10T 29/49128; Y10T 29/49126; Y10T 29/49124; Y10T 29/49117; Y10T 29/49002
USPC ............... 29/832, 829, 825, 592.1, 831, 830
See application file for complete search history.

(56) References Cited

U.S. PATENT DOCUMENTS

2015/0364400 A1* 12/2015 Dando ................. H01L 23/481
                                                            257/774
2016/0230286 A1*  8/2016 Wang .................... B65D 65/40

* cited by examiner

PACKAGE CARRIER AND MANUFACTURING METHOD THEREOF

CROSS-REFERENCE TO RELATED APPLICATION

This application claims the priority benefit of Taiwan application serial no. 104130526, filed on Sep. 16, 2015. The entirety of the above-mentioned patent application is hereby incorporated by reference herein and made a part of this specification.

BACKGROUND OF THE INVENTION

Field of the Invention

The present invention relates to a carrier structure and a method for manufacturing the same, and particularly relates to a package carrier and a method for manufacturing the same.

Description of Related Art

In general, the package carrier is mainly constructed by multiple patterned conductive layers and at least one insulation layer, wherein the insulation layer is disposed between two adjacent patterned conductive layers to achieve the insulation effect. In order to enhance the heat dissipation effect, a heat dissipation block is usually fixed to the lower surface of the package carrier via an adhesive layer, such that the heat generated by the electronic elements on the package carrier can transfer through the patterned conductive layer and the insulation layer to the heat dissipation block so as to perform thermal conductivity. Because the adhesive layer and the insulation layer generally have a poor thermal conductivity, the thermal resistance is increased when the heat generated by the electronic elements transfers through the insulation layer and the adhesive layer to the heat dissipation block, so as to result in poor heat dissipation. In addition, using the heat dissipation block fixed to the package carrier also increase the thickness of the package carrier so that the light and thin requirements for current products are unable to be fulfilled.

SUMMARY OF THE INVENTION

The invention provides a package carrier, which is adapted to carry at least one heat generating element.

The invention also provides a manufacturing method of the package carrier, which is adapted to manufacture the above-mentioned package carrier.

The package carrier of the invention includes a substrate, at least one heat conducting element, an insulating material, a first patterned circuit layer, and a second patterned circuit layer. The substrate has an upper surface and a lower surface opposite to each other, and a through hole connecting the upper surface and the lower surface. The heat conducting element is disposed inside the through hole and has a first surface and a second surface opposite to each other. The thickness of the heat conducting element is smaller than the thickness of the substrate. The insulating material is located between the heat conducting element and the inner wall of the through hole, and the heat conducting element is fixed in the through hole by the insulating material. The insulating material has a top surface and a bottom surface opposite to each other. The top surface of the insulating material and the upper surface of the substrate are approximately coplanar. The bottom surface of the insulating material, the lower surface of the substrate, and the second surface of the heat conducting element are approximately coplanar. The insulating material and the heat conducting element define at least one cavity extending from the top surface of the insulating material to the heat conducting element, and the cavity exposes a portion of the first surface of the heat conducting element. The first patterned circuit layer is disposed on the upper surface of the substrate and the top surface of the insulating material, and exposes portions of the substrate and the top surface. The second patterned circuit layer is disposed on the lower surface of the substrate and the bottom surface of the insulating material, and exposes portions of the substrate and the bottom surface.

In one embodiment of the invention, materials of the heat conducting element include ceramic, silicon, silicon carbide, diamond, metal, or a lamination layer formed by a combination thereof.

In one embodiment of the invention, the heat conducting element includes a first metal layer, a second metal layer, and a heat conducting material layer. The heat conducting material layer is disposed between the first metal layer and the second metal layer, and the first metal layer and the second metal layer have the first surface and the second surface respectively.

In one embodiment of the invention, the package carrier further includes a first solder mask layer and a second solder mask layer. The first solder mask layer is at least disposed on a portion of the first patterned circuit layer and the substrate exposed by the first patterned circuit layer. The second solder mask layer is at least disposed on the substrate exposed by the second patterned circuit layer.

In one embodiment of the invention, the package carrier further includes a first surface treatment layer and a second surface treatment layer. The first surface treatment layer is at least disposed on the first patterned circuit layer. The second surface treatment layer is disposed on the second patterned circuit layer.

In one embodiment of the invention, the first patterned circuit layer is further disposed on the inner wall of the cavity and the first surface of the heat conducting element exposed by the cavity.

In one embodiment of the invention, the first surface treatment layer is further disposed on the first surface of the heat conducting element exposed by the cavity.

In one embodiment of the invention, the at least one heat conducting element includes a first heat conducting element and a second heat conducting element. The at least one cavity includes a first cavity and a second cavity. The first cavity exposes a portion of the first heat conducting element and the second cavity exposes a portion of the second heat conducting element. The thickness of the first heat conducting element is smaller than the thickness of the second heat conducting element, and the depth of the first cavity is greater than the depth of the second cavity.

The invention provides the manufacturing method of the package carrier, which includes following steps. Providing a substrate, wherein the substrate has an upper surface and a lower surface opposite to each other, and a through hole connecting the upper surface and the lower surface. Disposing at least one heat conducting element inside the through hole of the substrate, wherein the thickness of the heat conducting element is smaller than the thickness of the substrate. The heat conducting element is fixed in the through hole by an insulating material, and the insulating material is located between the heat conducting element and the inner wall of the through hole. The insulating material has a top surface and a bottom surface opposite to each other, the heat conducting element has a first surface and a second surface opposite to each other, the top surface of the insulating material and the upper surface of the substrate are approximately coplanar, and the bottom surface of the insulating material, the lower surface of the substrate, and the second surface of the heat conducting element are approximately coplanar. Forming a first patterned circuit layer and a second patterned circuit layer. The first patterned circuit layer is at least formed on the upper surface of the substrate and the top surface of the insulating material and exposes portions of the substrate and the top surface. The second patterned circuit layer is formed on the lower surface of the substrate and the bottom surface of the insulating material and exposes portions of the substrate and the bottom surface. Forming at least one cavity extending from the top surface of the insulating material to the heat conducting element, wherein the cavity exposes a portion of the first surface of the heat conducting element.

In one embodiment of the invention, steps for disposing the heat conducting element inside the through hole of the substrate comprise: providing an adhesive layer on the lower surface of the substrate, wherein the adhesive layer and the through hole of the substrate define an accommodating space; disposing the heat conducting element on the adhesive layer and inside the accommodating space; filling the accommodating space with the insulating material to encapsulate the heat conducting element and to fix the heat conducting element in the through hole; and removing the adhesive layer to expose the lower surface of the substrate and the bottom surface of the insulating material.

In one embodiment of the invention, steps for forming the first patterned circuit layer and the second patterned circuit layer comprise: forming a first circuit layer and a second circuit layer, wherein the first circuit layer is formed on the upper surface of the substrate and the top surface of the insulating material, and the second circuit layer is formed on the lower surface of the substrate and the bottom surface of the insulating material; and patterning the first circuit layer and the second circuit layer to form the first patterned circuit layer and the second patterned circuit layer.

In one embodiment of the invention, steps after forming the cavity extending from the top surface of the insulating material to the heat conducting element further comprise: forming a first solder mask layer, wherein the first solder mask layer is at least disposed on a portion of the first patterned circuit layer and the substrate exposed by the first patterned circuit layer; and forming a second solder mask layer, wherein the second solder mask layer is at least disposed on the substrate exposed by the second patterned circuit layer.

In one embodiment of the invention, steps after forming the cavity extending from the top surface of the insulating material to the heat conducting element further comprise: forming a first surface treatment layer, wherein the first surface treatment layer is at least disposed on the first patterned circuit layer; and forming a second surface treatment layer, wherein the second surface treatment layer is disposed on the second patterned circuit layer.

In one embodiment of the invention, the first patterned circuit layer is further disposed on the inner wall of the cavity and the first surface of the heat conducting element exposed by the cavity.

In one embodiment of the invention, the first surface treatment layer is further disposed on the first surface of the heat conducting element exposed by the cavity.

In one embodiment of the invention, materials of the heat conducting element include ceramic, silicon, silicon carbide, diamond, metal, or a lamination layer formed by a combination thereof.

In one embodiment of the invention, the heat conducting element includes a first metal layer, a second metal layer, and a heat conducting material layer. The heat conducting material layer is disposed between the first metal layer and the second metal layer, and the first metal layer and the second metal layer have the first surface and the second surface respectively.

In one embodiment of the invention, the at least one heat conducting element includes a first heat conducting element and a second heat conducting element. The at least one cavity includes a first cavity and a second cavity. The first cavity exposes a portion of the first heat conducting element and the second cavity exposes a portion of the second heat conducting element. The thickness of the first heat conducting element is smaller than the thickness of the second heat conducting element, and the depth of the first cavity is greater than the depth of the second cavity.

Based on the above, the heat conducting element of the package carrier of the invention is fixed in the through hole of the substrate by the insulating material, and the cavity of the insulating material exposes a portion of the first surface of the heat conducting element. Therefore, subsequently, when the package carrier carries a heat generating element, the heat generating element can be disposed in the cavity of the insulating material, can directly contact the heat conducting element, and can electrically connect with the first surface treatment layer by the wire. As a result, in the package carrier of the invention, except that the heat generated by the heat conducting element can effectively transfer to the external environment, the wiring path is also shortened effectively, so as to reduce the thickness of the package structure.

In order to make the aforementioned and other features and advantages of the invention more comprehensible, embodiments accompanying figures are described in detail belows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
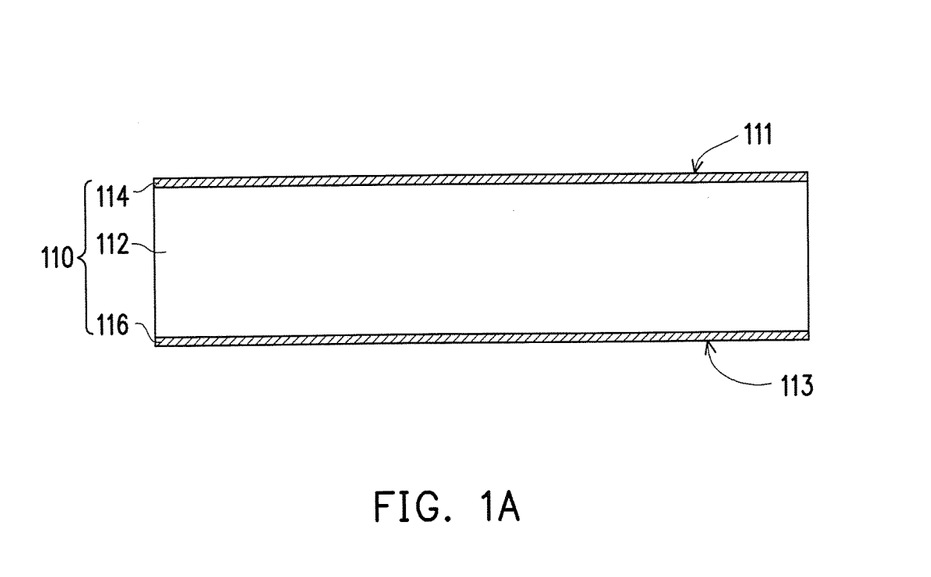
FIG. 1A to FIG. 1G are cross-sectional schematic views depicting a manufacturing method of a package carrier of one embodiment of the invention.

FIG. 1A to FIG. 1G are cross-sectional schematic views depicting a manufacturing method of a package carrier of one embodiment of the invention. According to the manufacturing method of the package carrier in the present embodiment, firstly, referring to FIG. 1A, providing a substrate 110, wherein the substrate 110 has an upper surface 111 and a lower surface 113 opposite to each other. The substrate 110 of the present embodiment can be, for example, a single layer circuit board, a double layer circuit board, or a multi-layer circuit board. Herein, as shown in FIG. 1A, the substrate 110 is a double layer circuit board which is constructed by a dielectric layer 112 and circuit layers 114, 116 located at two opposite sides of the dielectric layer 112, but the invention is not limited thereto.

Figure 1B:
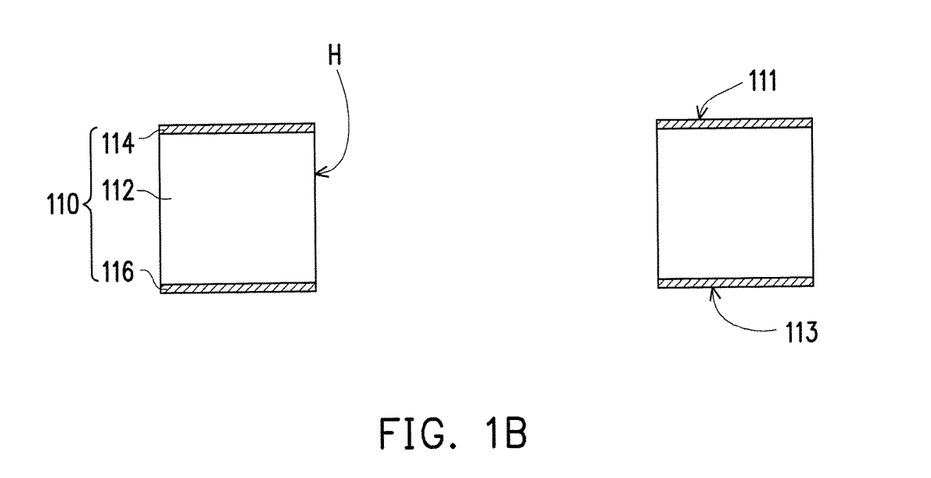

Subsequently, referring to FIG. 1B, a through hole H connecting the upper surface 111 and the lower surface 113 is formed in the substrate 110 by punching, routing, mechanical drilling, laser drilling, or other appropriate methods.

Figure 1C:
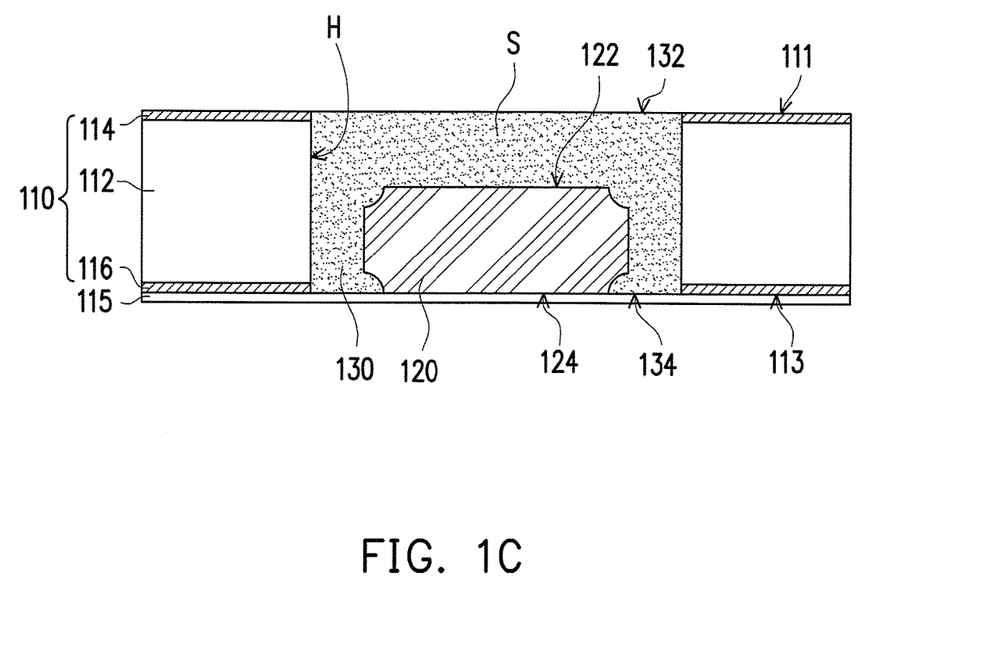

Subsequently, referring to FIG. 1C, providing an adhesive layer 115 on the lower surface 113 of the substrate 110, wherein the adhesive layer 115 and the through hole H of the substrate 110 define an accommodating space S. It should be noted here, the adhesive layer 115 is only adhered to the lower surface 113 of the substrate 110 temporarily to serve as a supporting element for a subsequent heat conducting element 120. Subsequently, the heat conducting element 120 is disposed on the adhesive layer 115 and located inside the accommodating space S, wherein the thickness of the heat conducting element 120 is smaller than the thickness of the substrate 110, the thickness of the heat conducting element 120 is, for example, from one tenth to nine-tenths of the thickness of the substrate 110, and will not be limited thereto. The heat conducting element 120 has a first surface 122 and a second surface 124 opposite to each other, and the second surface 124 directly contacts the adhesive layer 115. Herein, materials of the heat conducting element 120 include ceramic, silicon, silicon carbide, diamond, metal, or a lamination layer formed by a combination thereof.

Subsequently, referring to FIG. 1C, an insulating material 130 fills the accommodating space S so as to encapsulate the heat conducting element 120 and to fix the heat conducting element 120 in the through hole H of the substrate 110, wherein the insulating material 130 has a top surface 132 and a bottom surface 134 opposite to each other. At this time, as shown in FIG. 1C, the heat conducting element 120 is fixed in the through hole H of the substrate 110 by the insulating material 130, and the insulating material 130 is located between the heat conducting element 120 and the inner wall of the through hole H. In other words, the insulating material 130 is used to fix the relative position between the heat conducting element 120 and the substrate 110.

Figure 1D:
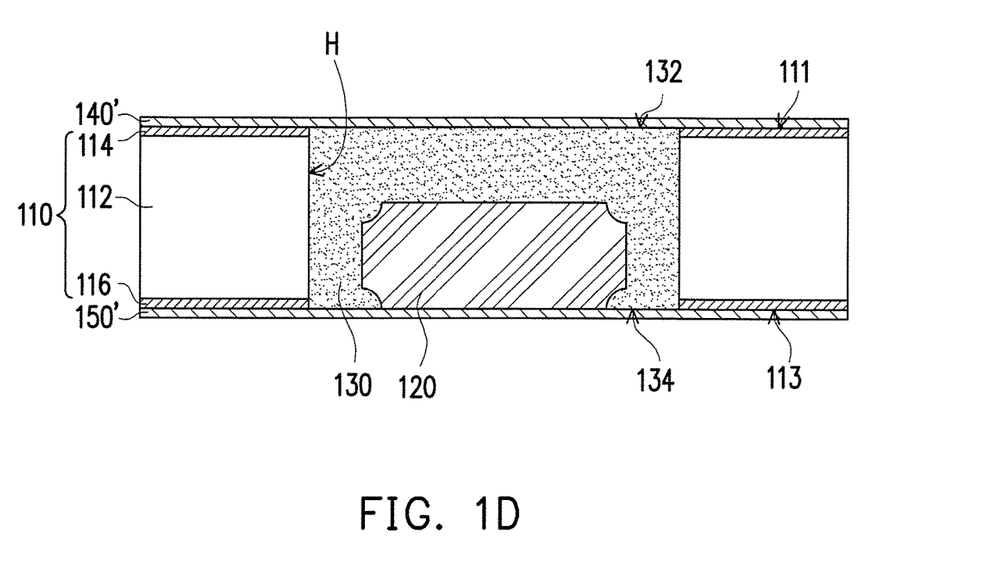

Subsequently, referring to FIG. 1C and FIG. 1D simultaneously, removing the adhesive layer 115 to expose the lower surface 113 of the substrate 110 and the bottom surface 134 of the insulating material 130. At this time, the top surface 132 of the insulating material 130 and the upper surface 111 of the substrate 110 are approximately coplanar, and the bottom surface 134 of the insulating material 130, the lower surface 113 of the substrate 110, and the second surface 124 of the heat conducting element 120 are approximately coplanar, it means a package carrier 100a which is subsequently formed (referring to FIG. 1G) can have a better surface flatness. At this point, steps for disposing the heat conducting element 120 inside the through hole H of the substrate 110 are completed.

Subsequently, referring to FIG. 1D, forming a first circuit layer 140' and a second circuit layer 150', wherein the first circuit layer 140' is formed on the upper surface 111 of the substrate 110 and the top surface 132 of the insulating material 130, and the second circuit layer 150' is formed on the lower surface 113 of the substrate 110 and the bottom surface 134 of the insulating material 130. Herein, the method to form the first circuit layer 140' and the second circuit layer 150' is, for example, electroplating method.

Figure 1E:
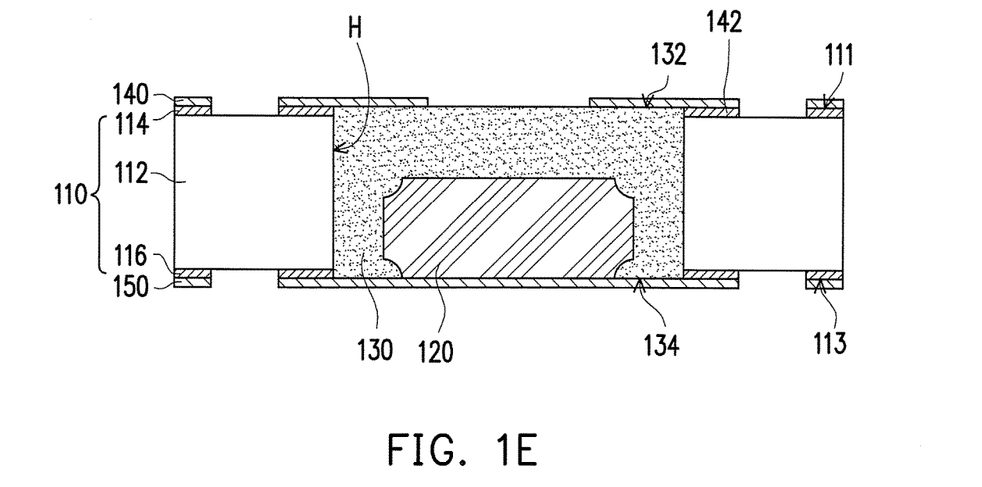

Next, referring to FIG. 1E, patterning the first circuit layer 140' and the second circuit layer 150', so as to form a first patterned circuit layer 140 and a second patterned circuit layer 150. At this time, the first patterned circuit layer 140 is formed on the upper surface 111 of the substrate 110 and the top surface 132 of the insulating material 130, and exposes a portion of the dielectric layer 112 of the substrate 110 and a portion of the top surface 132 of the insulating material 130. The second patterned circuit layer 150 is formed on the lower surface 113 of the substrate 110 and the bottom surface 134 of the insulating material 130, and exposes a portion of the dielectric layer 112 of the substrate 110 and a portion of the bottom surface 134 of the insulating material 130.

Figure 1F:
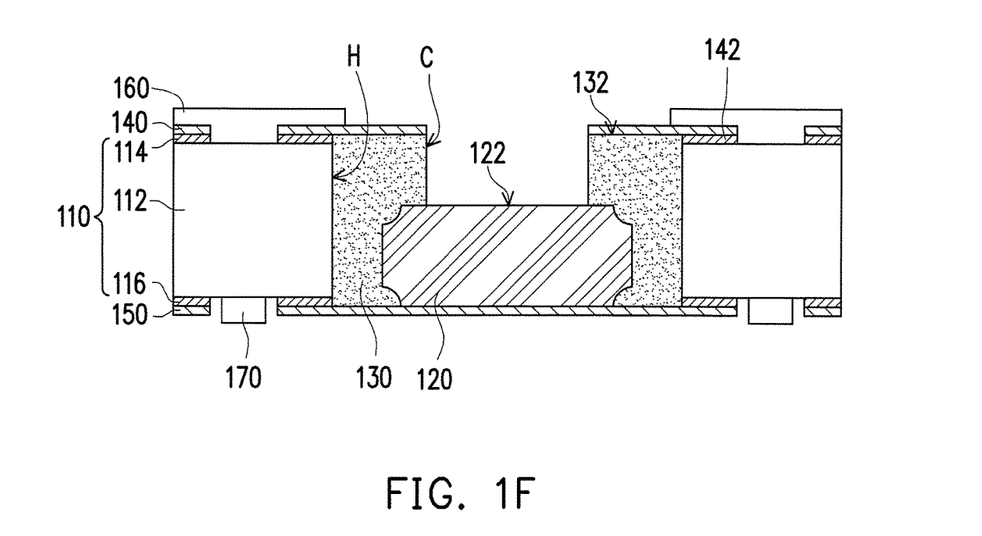

After that, referring to FIG. 1F, the first patterned circuit layer 140 serving as a mask, forming at least one cavity C extending from the top surface 132 of the insulating material 130 to the heat conducting element 120, wherein the cavity C exposes a portion of the first surface 122 of the heat conducting element 120. Herein, the first patterned circuit layer 140 can serve as the mask to form the cavity C by laser ablation or routing method. In addition, after forming the cavity C, optionally forming a first solder mask layer 160 and a second solder mask layer 170, wherein the first solder mask layer 160 is at least disposed on a portion of the first patterned circuit layer 140 and the dielectric layer 112, which is exposed by the first patterned circuit layer 140, of the substrate 110, and the second solder mask layer 170 is at least disposed on the dielectric layer 112, which is exposed by the second patterned circuit layer 150, of the substrate 110.

Figure 1G:
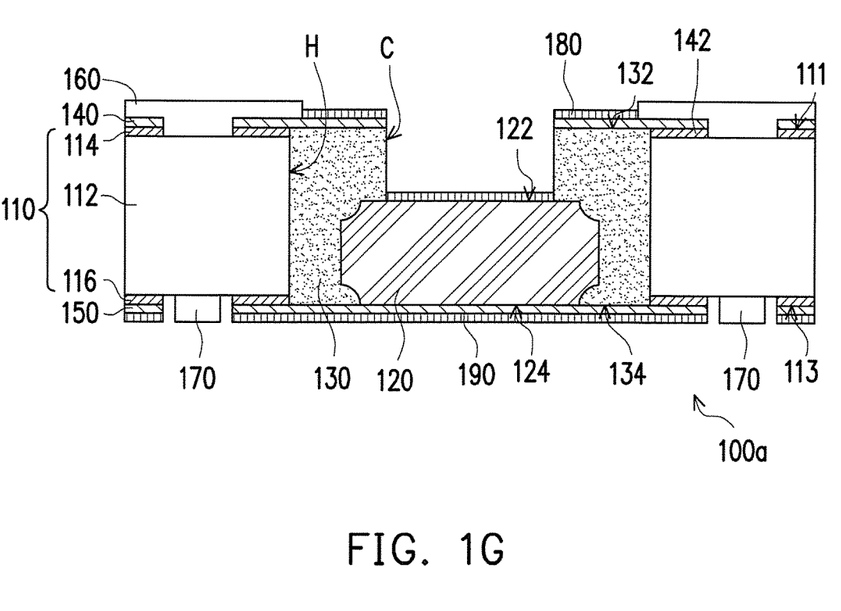

Finally, referring to FIG. 1G, in order to maintain the structural properties of the exposed first patterned circuit layer 140 and the exposed second patterned circuit layer 150, forming a first surface treatment layer 180 and a second surface treatment layer 190, wherein the first surface treatment layer 180 is at least disposed on the first patterned circuit layer 140 exposed by the first solder mask layer 160, and the second surface treatment layer 190 is disposed on the second patterned circuit layer 150. Herein, the first surface treatment layer 180 is further disposed on the first surface 122, which is exposed by the cavity C, of the heat conducting element 120. The material of the first surface treatment layer 180 and the second surface treatment layer 190 in the present embodiment is, for example, nickel, palladium, gold, or alloys of the said materials, so as to prevent the first patterned circuit layer 140 and the second patterned circuit layer 150 from being oxidized or being subject to the external contamination. So far, the package carrier 100a is completely manufactured.

In above structure, referring to FIG. 1G, the package carrier 100a of the present embodiment includes the substrate 110, the heat conducting element 120, the insulating material 130, the first patterned circuit layer 140, and the second patterned circuit layer 150. The substrate 110 has the upper surface 111 and the lower surface 113 opposite to each other, and the through hole H connecting the upper surface 111 and the lower surface 113. The heat conducting element 120 is disposed inside the through hole H and has a first surface 122 and a second surface 124 opposite to each other. The thickness of the heat conducting element 120 is smaller than the thickness of the substrate 110. The insulating material 130 is located between the heat conducting element 120 and the inner wall of the through hole H, and the heat conducting element 120 is fixed in the through hole H by the insulating material 130. The insulating material 130 has the top surface 132 and the bottom surface 134 opposite to each other. The top surface 132 of the insulating material 130 and the upper surface 111 of the substrate 110 are approximately coplanar. The bottom surface 134 of the insulating material 130, the lower surface 113 of the substrate 110, and the second surface 124 of the heat conducting element 120 are approximately coplanar. The insulating material 130 and the heat conducting element 120 define at least one cavity C extending from the top surface 132 of the insulating material 130 to the heat conducting element 120, and the cavity C exposes a portion of the first surface 122 of the heat conducting element 120. The first patterned circuit layer 140 is disposed on the upper surface 111 of the substrate 110 and the top surface 132 of the insulating material 130, and exposes a portion of the dielectric layer 112 of the substrate 110 and a portion of the top surface 132 of the insulating material 130. The second patterned circuit layer 150 is disposed on the lower surface 113 of the substrate 110 and the bottom surface 134 of the insulating material 130, and exposes a portion of the dielectric layer 112 of the substrate 110 and a portion of the bottom surface 134 of the insulating material 130.

In addition, the package carrier 100a of the present embodiment further includes the first solder mask layer 160 and the second solder mask layer 170, wherein the first solder mask layer 160 is at least disposed on a portion of the first patterned circuit layer 140 and the dielectric layer 112, which is exposed by the first patterned circuit layer 140, of the substrate 110, and the second solder mask layer 170 is at least disposed on the dielectric layer 112, which is exposed by the second patterned circuit layer 150, of the substrate 110. Otherwise, in order to maintain the structural properties of the exposed first patterned circuit layer 140 and the exposed second patterned circuit layer 150, the package carrier 100a of the present embodiment further includes the first surface treatment layer 180 and the second surface treatment layer 190, wherein the first surface treatment layer 180 is disposed on the first patterned circuit layer 140 exposed by the first solder mask layer 160, and the second surface treatment layer 190 is disposed on the second patterned circuit layer 150.

Figure 4:
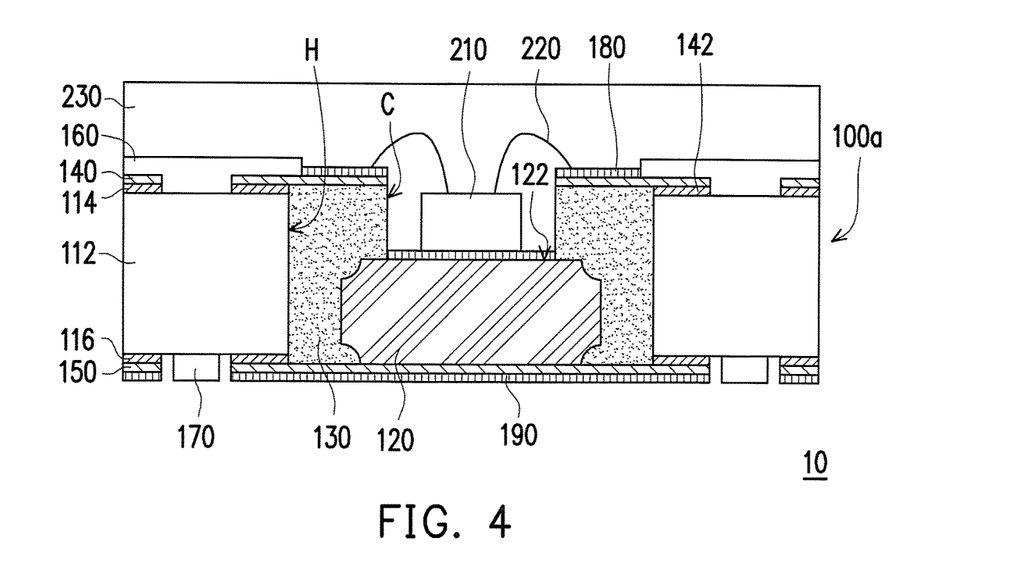
FIG. 4 is a cross-sectional schematic view depicting the package carrier in FIG. 1G carrying a heat generating element.

The heat conducting element 120 of the package carrier 100a of the present embodiment is fixed in the through hole H of the substrate 110 by the insulating material 130, and the cavity C of the insulating material 130 exposes a portion of the first surface 122 of the heat conducting element 120. Therefore, referring to FIG. 4, subsequently, when the package carrier 100a carries the heat generating element 210, the heat generating element 210 can be disposed in the cavity C of the insulating material 130, can directly contact the first surface treatment layer 180 located on the first surface 122 of the heat conducting element 120, and can electrically connect with the first surface treatment layer 180 located on the first patterned circuit layer 140 by a plurality of wires 220. In addition, the heat generating element 210, the wire 220, and the first solder mask layer 160 and the first surface treatment layer 180 of the package carrier 100a are encapsulated by a molding compound 230 so as to form a package structure 10. As a result, in the package carrier 100a of the present embodiment, except that the heat generated by the heat conducting element 210 can effectively and rapidly transfer sequentially through the first surface treatment layer 180, the heat conducting element 120, the second patterned circuit layer 150, and the second surface treatment layer 190 to the external environment, the wiring path of the wire 220 is also shortened effectively because of the configurational position of the heat conducting element 210, so as to effectively reduce the thickness of the package structure 10 that is formed.

Figure 2:
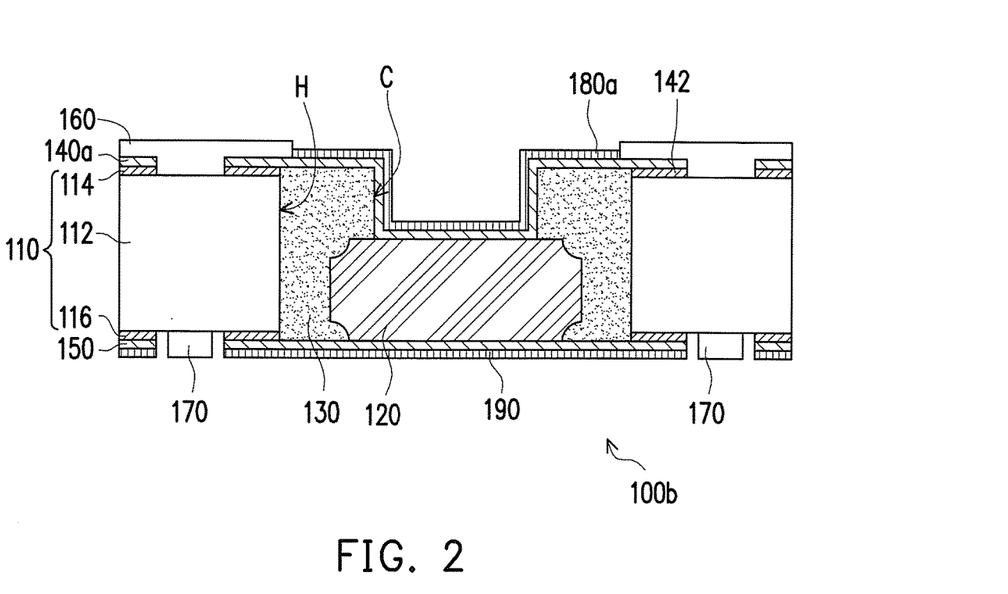
FIG. 2 is a cross-sectional schematic view depicting a package carrier of one embodiment of the invention.

It should be noted here, the present embodiment is not limited to the forming sequence of the cavity C of the insulating material 130, the first patterned circuit layer 140, and the second patterned circuit layer 150. In the above-mentioned embodiment, although the cavity C of the insulating material 130 is formed after the first patterned circuit layer 140 and the second patterned circuit layer 150, in another embodiment, referring to FIG. 2, the cavity C of the insulating material 130 of the package carrier 100b can also be formed before the first patterned circuit layer 140a and the second patterned circuit layer 150a, and therefore the first patterned circuit layer 140a is further disposed on the inner wall of the cavity C and the first surface 122 of the heat conducting element 120 exposed by the cavity C. In addition, the first surface treatment layer 180a that is subsequently formed can further disposed on the first patterned circuit layer 140a on the first surface 122 of the heat conducting element 120 exposed by the cavity C. In other words, at least the first patterned circuit layer 140a and the first surface treatment layer 180a located on the first patterned circuit layer 140a are disposed on the cavity C of the insulating material 130.

Figure 5:
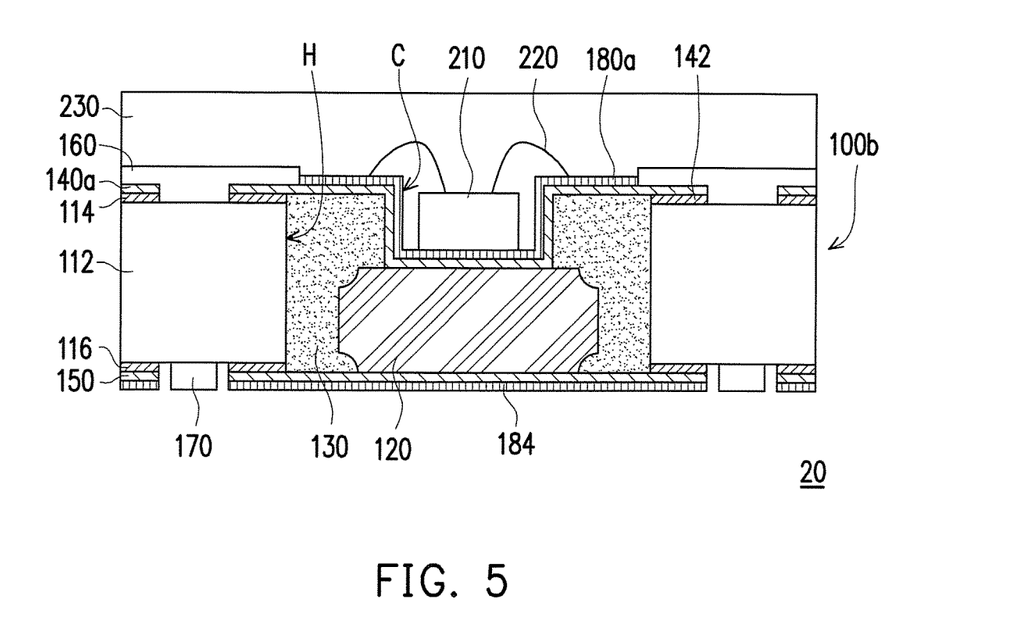
FIG. 5 is a cross-sectional schematic view depicting the package carrier in FIG. 2 carrying a heat generating element.

Referring to FIG. 5, subsequently, when the package carrier 100b carries the heat generating element 210, the heat generating element 210 can be disposed in the cavity C of the insulating material 130, can directly contact the first surface treatment layer 180a, and can electrically connect with the first surface treatment layer 180a located on the first patterned circuit layer 140a by the wire 220. In addition, the heat generating element 210, the wire 220, and the first solder mask layer 160 and the first surface treatment layer 180a of the package carrier 100b are encapsulated by the molding compound 230 so as to form a package structure 20. As a result, in the package carrier 100b of the present embodiment, except that the heat generated by the heat conducting element 210 can effectively and rapidly transfer sequentially through the first surface treatment layer 180a, the first patterned circuit layer 140a, the heat conducting element 120, the second patterned circuit layer 150, and the second surface treatment layer 190 to the external environment, the wiring path of the wire 220 is also shortened effectively because of the configurational position of the heat conducting element 210, so as to effectively reduce the thickness of the package structure 20 that is formed.

Figure 3:
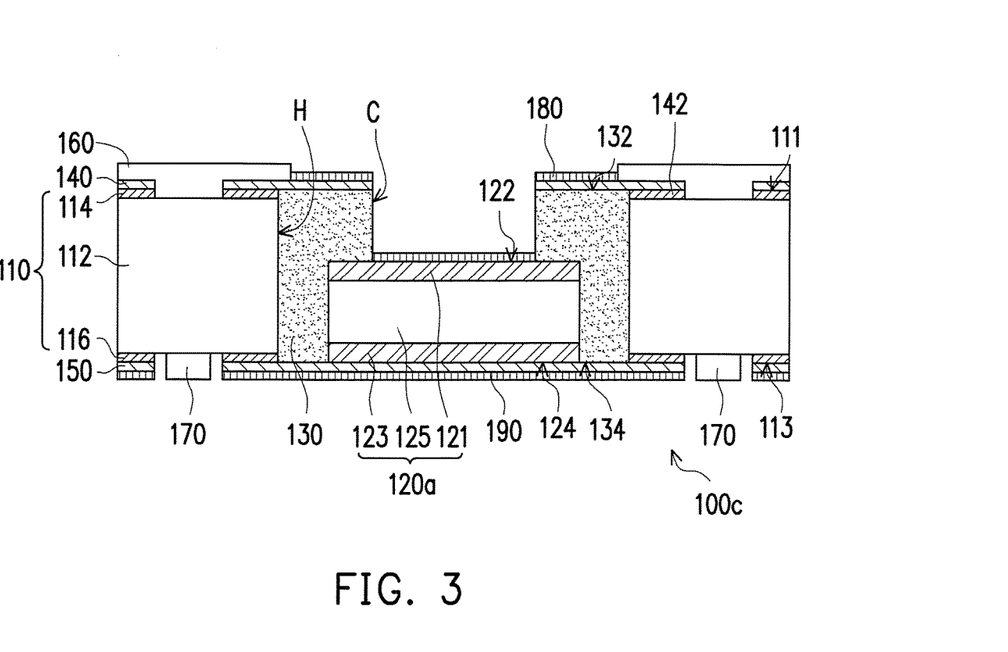
FIG. 3 is a cross-sectional schematic view depicting a package carrier of one embodiment of the invention.

In addition, the present embodiment is also not limited to the structure type of the heat conducting element 120. In above-mentioned embodiment, although the heat conducting element 120 is embodied as a block structure having arc-shaped corners so as to increase the adhesion force between the heat conducting element 120 and the insulating material 130, but in another embodiment, referring to FIG. 3, the heat conducting element 120a of the package carrier 100c in the present embodiment can also be formed by a first metal layer 121, a second metal layer 123, and a heat conducting material layer 125, wherein the heat conducting material layer 125 is disposed between the first metal layer 121 and the second metal layer 123, and the first metal layer 121 and the second metal layer 123 have the first surface 122 and the second surface 124 respectively. Herein, materials of the heat conducting material layer 125 include ceramic, silicon, silicon carbide, diamond, etc., the ceramic material is, for example, alumina, aluminum nitride, etc., but the invention is not be limited thereto.

In addition, it should be noted here, the invention is not limited to the quantity of cavity C of the insulating material 130, and to the quantity of each of the heat conducting elements 120, 120a disposed in the package carriers 100a, 100b, 100c. In above-mentioned embodiment, the quantity of the cavity C of the insulating material 130 is one, and the quantity of each of the heat conducting elements 120, 120a disposed in the package carriers 100a, 100b, 100c is also one. However, in other embodiments, referring to FIG. 6, the package carrier 100d of the present embodiment has two heat conducting elements, namely a first heat conducting element 120b and a second heat conducting element 120c, and the insulating material 130' has a first cavity C1 and a second cavity C2. The first cavity C1 exposes a portion of the first heat conducting element 120b and the second cavity C2 exposes a portion of the second heat conducting element 120c. The thickness T1 of the first heat conducting element 120b is smaller than the thickness T2 of the second heat conducting element 120c, and the depth D1 of the first cavity C1 is greater than the depth D2 of the second cavity C2. Because the insulating material 130' of the present embodiment has the first cavity C1 and the second cavity C2, the package carrier 100d is adapted to carry two heat generating elements 210a, 210b.

Figure 6:
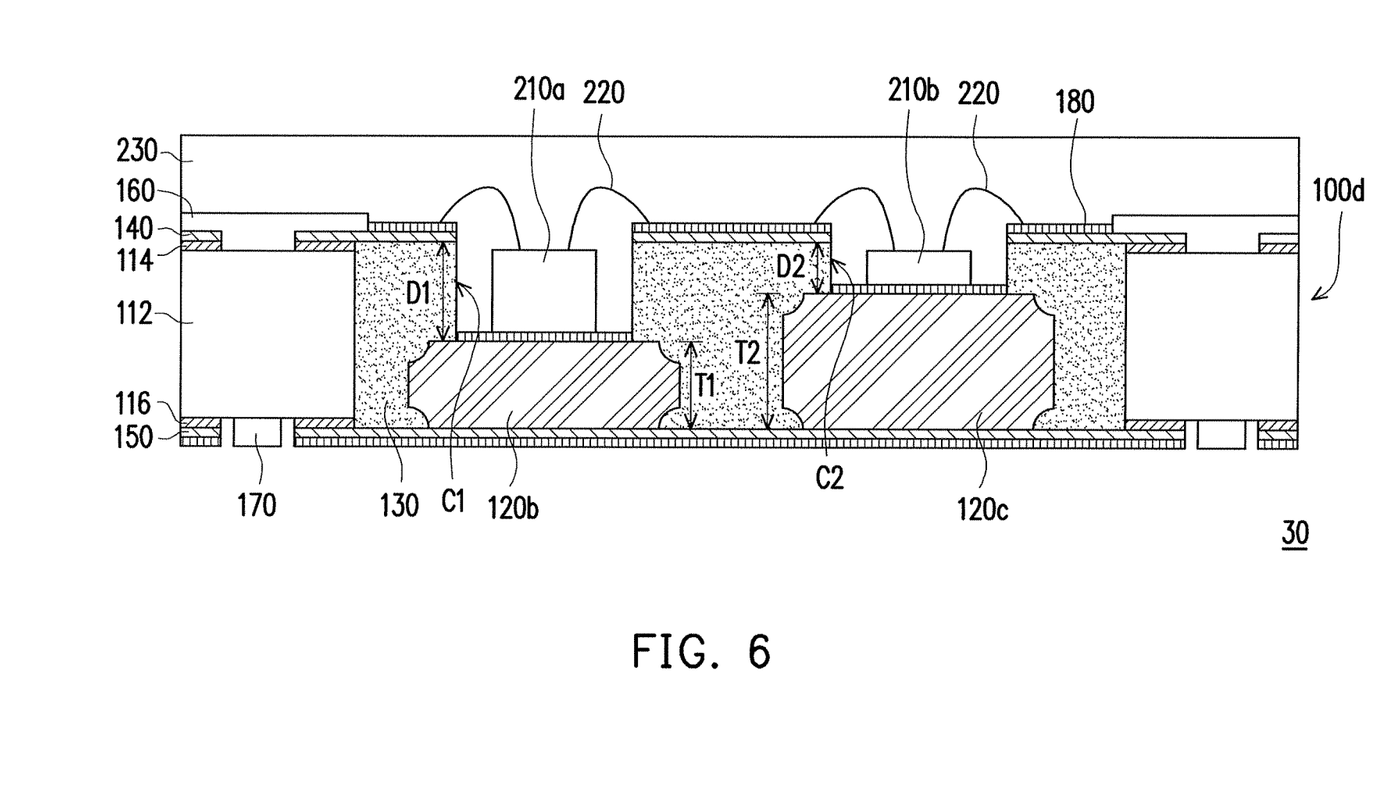
FIG. 6 depicts a package carrier carrying two heat generating elements according to one embodiment of the invention.

Referring to FIG. 6, subsequently, when the package carrier 100d carries the heat generating elements 210a, 210b, the heat generating elements 210a, 210b can be respectively disposed in the first cavity C1 and the second cavity C2 of the insulating material 130', can directly contact the first surface treatment layer 180, and can electrically connect with the first surface treatment layer 180 located on the first patterned circuit layer 140 on the upper surface 111 of the substrate 110 by the wire 220. In addition, the heat generating elements 210a, 210b, the wire 220, and the first solder mask layer 160 and the first surface treatment layer 180 of the package carrier 100d are encapsulated by the molding compound 230 so as to form a package structure 30. As a result, in the package carrier 100d of the present embodiment, except that the heat generated by the heat conducting elements 210a, 210b can effectively and rapidly transfer through the first surface treatment layer 180, the first heat conducting element 120b, the second heat conducting element 120b, the second patterned circuit layer 150, and the second surface treatment layer 190 to the external environment, the wiring path of the wire 220 is also shortened effectively because of the configurational position of the heat conducting elements 210a, 210b, so as to simultaneously reduce the wiring cost and to effectively reduce the thickness of the package structure 30 that is formed.

In summary, the heat conducting element of the package carrier of the invention is fixed in the through hole of the substrate by the insulating material, and the cavity of the insulating material exposes a portion of the first surface of the heat conducting element. Therefore, subsequently, when the package carrier carries a heat generating element, the heat generating element can be disposed in the cavity of the insulating material, can directly contact the heat conducting element, and can electrically connect with the first surface treatment layer by the wire. As a result, in the package carrier of the invention, except that the heat generated by the heat conducting element can effectively transfer to the external environment, the wiring path is also shortened effectively, so as to reduce cost and to reduce the thickness of the package structure.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a package carrier, adapted to carry at least one heat generating element, and the manufacturing method of the package carrier, comprising:
    providing a substrate, wherein the substrate has an upper surface and a lower surface opposite to each other, and a through hole connecting the upper surface and the lower surface;
    disposing at least one heat conducting element inside the through hole of the substrate, wherein a thickness of the heat conducting element is smaller than a thickness of the substrate, the heat conducting element is fixed in the through hole by an insulating material and the insulating material is located between the heat conducting element and an inner wall of the through hole, wherein the insulating material has a top surface and a bottom surface opposite to each other, the heat conducting element has a first surface and a second surface opposite to each other, the top surface of the insulating material and the upper surface of the substrate are approximately coplanar, and the bottom surface of the insulating material, the lower surface of the substrate, and the second surface of the heat conducting element are approximately coplanar;
    forming a first patterned circuit layer and a second patterned circuit layer, wherein the first patterned circuit layer is at least formed on the upper surface of the substrate and the top surface of the insulating material and exposes portions of the substrate and the top surface, and the second patterned circuit layer is formed on the lower surface of the substrate and the bottom surface of the insulating material, and exposes portions of the substrate and the bottom surface; and
    forming at least one cavity having a depth and extending from the top surface of the insulating material to the heat conducting element, wherein the cavity exposes a portion of the first surface of the heat conducting element, and the first surface of the heat conducting element is lower than the top surface of the insulating material.

2. The manufacturing method of the package carrier as recited in claim 1, wherein steps for disposing the heat conducting element inside the through hole of the substrate comprise:
    providing an adhesive layer on the lower surface of the substrate, wherein the adhesive layer and the through hole of the substrate define an accommodating space;
    disposing the heat conducting element on the adhesive layer and inside the accommodating space;
    filling the accommodating space with the insulating material to encapsulate the heat conducting element and to fix the heat conducting element in the through hole; and
    removing the adhesive layer to expose the lower surface of the substrate and the bottom surface of the insulating material.

3. The manufacturing method of the package carrier as recited in claim 1, wherein steps for forming the first patterned circuit layer and the second patterned circuit layer comprise:

forming a first circuit layer and a second circuit layer, wherein the first circuit layer is formed on the upper surface of the substrate and the top surface of the insulating material, and the second circuit layer is formed on the lower surface of the substrate and the bottom surface of the insulating material; and patterning the first circuit layer and the second circuit layer to form the first patterned circuit layer and the second patterned circuit layer.

4. The manufacturing method of the package carrier as recited in claim 1, wherein steps after forming the cavity extending from the top surface of the insulating material to the heat conducting element further comprise:

forming a first solder mask layer, wherein the first solder mask layer is at least disposed on a portion of the first patterned circuit layer and the substrate exposed by the first patterned circuit layer; and forming a second solder mask layer, wherein the second solder mask layer is at least disposed on the substrate exposed by the second patterned circuit layer.

5. The manufacturing method of the package carrier as recited in claim 1, wherein steps after forming the cavity extending from the top surface of the insulating material to the heat conducting element further comprise:

forming a first surface treatment layer, wherein the first surface treatment layer is at least disposed on the first patterned circuit layer; and forming a second surface treatment layer, wherein the second surface treatment layer is disposed on the second patterned circuit layer.

6. The manufacturing method of the package carrier as recited in claim 5, wherein the first patterned circuit layer is further disposed on an inner wall of the cavity and the first surface of the heat conducting element exposed by the cavity.

7. The manufacturing method of the package carrier as recited in claim 5, wherein the first surface treatment layer is further disposed on the first surface of the heat conducting element exposed by the cavity.

8. The manufacturing method of the package carrier as recited in claim 1, wherein materials of the heat conducting element comprise ceramic, silicon, silicon carbide, diamond, metal, or a lamination layer formed by a combination thereof.

9. The manufacturing method of the package carrier as recited in claim 1, wherein the heat conducting element comprises a first metal layer, a second metal layer, and a heat conducting material layer, the heat conducting material layer is disposed between the first metal layer and the second metal layer, and the first metal layer and the second metal layer have the first surface and the second surface respectively.

10. The manufacturing method of the package carrier as recited in claim 1, wherein the at least one heat conducting element comprises a first heat conducting element and a second heat conducting element, the at least one cavity comprises a first cavity and a second cavity, the first cavity exposes a portion of the first heat conducting element, the second cavity exposes a portion of the second heat conducting element, and a thickness of the first heat conducting element is smaller than a thickness of the second heat conducting element and a depth of the first cavity is greater than a depth of the second cavity.

11. A manufacturing method of a package structure, comprising:

providing a substrate, wherein the substrate has an upper surface and a lower surface opposite to each other, and a through hole connecting the upper surface and the lower surface;

disposing at least one heat conducting element inside the through hole of the substrate, wherein a thickness of the heat conducting element is smaller than a thickness of the substrate, the heat conducting element is fixed in the through hole by an insulating material and the insulating material is located between the heat conducting element and an inner wall of the through hole, wherein the insulating material has a top surface and a bottom surface opposite to each other, the heat conducting element has a first surface and a second surface opposite to each other, the top surface of the insulating material and the upper surface of the substrate are approximately coplanar, and the bottom surface of the insulating material, the lower surface of the substrate, and the second surface of the heat conducting element are approximately coplanar;

forming a first patterned circuit layer and a second patterned circuit layer, wherein the first patterned circuit layer is at least formed on the upper surface of the substrate and the top surface of the insulating material and exposes portions of the substrate and the top surface, and the second patterned circuit layer is formed on the lower surface of the substrate and the bottom surface of the insulating material, and exposes portions of the substrate and the bottom surface;

forming at least one cavity having a depth and extending from the top surface of the insulating material to the heat conducting element, wherein the cavity exposes a portion of the first surface of the heat conducting element, and the first surface of the heat conducting element is lower than the top surface of the insulating material; and depositing at least one heat generating element in the cavity and on the first surface of the heat conducting element.

12. A manufacturing method of a package carrier, comprising:

providing a substrate, wherein the substrate has an upper surface and a lower surface opposite to each other, and at least one through hole connecting the upper surface and the lower surface;

disposing at least a first heat conducting element and a second heat conducting element inside the at least one through hole of the substrate, wherein a thickness of the first heat conducting element and the second heat conducting element respectively is smaller than a thickness of the substrate, each of the first heat conducting element and the second heat conducting element is respectively fixed in the at least one through hole by an insulating material and the insulating material is at least located between the first heat conducting element and an inner wall of the through hole and between the second heat conducting element and the inner wall of the through hole, wherein the insulating material has a top surface and a bottom surface opposite to each other, the first heat conducting element and the second heat conducting element respectively has a first surface and a second surface opposite to each other, the top surface of the insulating material and the upper surface of the substrate are approximately coplanar, and the bottom surface of the insulating material, the lower surface of the substrate, and the second surface of the first heat conducting element and the second heat conducting element are approximately coplanar;

forming a first patterned circuit layer and a second patterned circuit layer, wherein the first patterned circuit layer is at least formed on the upper surface of the substrate and the top surface of the insulating material and exposes portions of the substrate and the top surface, and the second patterned circuit layer is formed on the lower surface of the substrate and the bottom surface of the insulating material, and exposes portions of the substrate and the bottom surface; and forming at least a first cavity and a second cavity respectively extending from the top surface of the insulating material to the first heat conducting element and the second heat conducting element, wherein the first cavity exposes a portion of the first heat conducting element, the second cavity exposes a portion of the second heat conducting element, and a thickness of the first heat conducting element is smaller than a thickness of the second heat conducting element and a depth of the first cavity is greater than a depth of the second cavity.

* * * * *